(12) United States Patent
Yano

(10) Patent No.: US 8,410,827 B2
(45) Date of Patent: Apr. 2, 2013

(54) TRANSMITTER, INTERFACE DEVICE, AND CAR MOUNTED COMMUNICATION SYSTEM

(75) Inventor: Yuji Yano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 164 days.

(21) Appl. No.: 13/113,235

(22) Filed: May 23, 2011

(65) Prior Publication Data

US 2011/0291733 A1  Dec. 1, 2011

(30) Foreign Application Priority Data

May 31, 2010 (JP) .................................. 2010-123950

(51) Int. Cl.
*H03K 3/00* (2006.01)
(52) U.S. Cl. ........................................ 327/108; 327/112
(58) Field of Classification Search ........... 327/108–112
See application file for complete search history.

(56) References Cited

U.S. PATENT DOCUMENTS

| | | | | |
|---|---|---|---|---|
| 6,392,904 B1* | 5/2002 | Bayer et al. | ...................... | 363/59 |
| 6,459,602 B1* | 10/2002 | Lipcsei | ......................... | 363/132 |
| 7,986,175 B2* | 7/2011 | Ebuchi et al. | ................. | 327/147 |
| 7,999,601 B2* | 8/2011 | Schlueter et al. | ............. | 327/383 |
| 8,013,664 B2* | 9/2011 | Gerber | ......................... | 327/536 |
| 8,305,053 B2* | 11/2012 | Truong et al. | ................. | 323/224 |

FOREIGN PATENT DOCUMENTS

JP  2009-202720  9/2009

* cited by examiner

*Primary Examiner* — Kenneth B. Wells
(74) *Attorney, Agent, or Firm* — Fish & Richardson P.C.

(57) ABSTRACT

A transmitter includes a capacitor from one end of which a charge voltage is derived; a first constant current source to generate a charge current for the capacitor; a second constant current source to generate a discharge current for the capacitor; a charge/discharge controller to perform charge/discharge control of the capacitor based on a logic level of a transmission input signal and a comparison result between the charge voltage and a reference voltage; an output stage to generate the transmission output signal, wherein a slew rate of which is set in response to the charge voltage, and wherein an amplitude of the transmission output signal is set in response to an output side power source voltage; a reference voltage generator to fluctuate the reference voltage depend on the output side power source voltage; and a constant current controller to fluctuate a current value of the charge current and the discharge current depend on the reference voltage.

15 Claims, 15 Drawing Sheets

TRANSMITTER, INTERFACE DEVICE, AND CAR MOUNTED COMMUNICATION SYSTEM

CROSS-REFERENCE TO RELATED APPLICATIONS

This application claims the benefit of priority of Japanese patent application No. 2010-123950 (filing date: 2010/05/31), which is incorporated herein by reference in its entirety.

BACKGROUND OF THE INVENTION

1. Field of the Invention

This disclosure relates to a transmitter having a slew rate control function, and an interface device and a car mounted communication system using the transmitter.

2. Description of Related Art

FIG. 6 is a circuit diagram showing a transmitter having a slew rate control function in accordance with the related art. With respect to the transmitter in accordance with the related art, a switching controller 306 operates in response to a rising edge of an input signal IN, and turns ON a switch 301 and turns OFF a switch 302. According to thus switching control, a charge current I1 (a current value=+I) flows into a capacitor 305 (a capacitance=C) from a constant current source 303 via the switch 301. As a result, a voltage value of an output signal OUT derived from one end (high potential side) of the capacitor 305, begins to rise at a constant slew rate SR1 (SR1=+I/C[V/S]) in response to a current value of the charge current I1 and a capacitance of the capacitor 305.

The switching controller 306 turns OFF the switch 301 when a voltage value of the output signal OUT reaches to a reference voltage Vref. As a result of thus switching control, an output voltage VOUT is maintained approximately same as the reference voltage Vref by the capacitor 305.

The switching controller 306 turns OFF the switch 301 and turns ON the switch 302 in response to a falling edge of the input signal IN. As a result of this switching control, a discharge current I2 (a current value=−I) is provided from the capacitor 305 to a constant current source 304 via the switch 302. As a result, a voltage value of the output signal OUT begins to fall at a constant slew rate SR2 (SR2=−I/C [V/S]) in response to a current value of the discharge current I2 and a capacitance of the capacitor 305.

A related technique of a car mounted communication system is disclosed in Japanese patent publication No. 2009-202720.

SUMMARY OF THE INVENTION

In the above mentioned transmitter in accordance with the related art, a current value of the charge current I1 and a current value of the discharge current I2 are set at predetermined values, and a slew rate SR1 of a rising edge and a slew rate SR2 of a falling edge about the output signal OUT are set at predetermined values. As a result, if the reference voltage Vref maintains constant value, a rising time and a falling time of the output signal OUT are maintained in a constant value. However, if the reference voltage Vref fluctuates widely, the rising time and the falling time of the output signal OUT fluctuates widely shown in FIG. 7. Thus fluctuations of a duty is caused between the input signal IN and the output signal OUT.

In some implementations, the present disclosure provides a transmitter that reduces fluctuations of a duty of an input signal and an output signal caused by fluctuations in power source voltage. In some implementations, the present disclosure also provides an interface device and a car mounted communication system using the transmitter.

In one aspect, the transmitter includes a capacitor from one end of which a charge voltage is derived, a first constant current source to generate a charge current for the capacitor, a second constant current source to generate a discharge current for the capacitor, a charge/discharge controller to perform charge/discharge control of the capacitor based on a logic level of a transmission input signal and a comparison result between the charge voltage and a reference voltage, an output stage to generate the transmission output signal, a slew rate of which is set in response to the charge voltage, and an amplitude of the transmission output signal is set in response to an output side power source voltage. The transmitter also includes a reference voltage generator to fluctuate the reference voltage depend on the output side power source voltage, and a constant current controller to fluctuate a current value of the charge current and the discharge current depend on the reference voltage.

Other features, elements, steps, advantages, and characteristics will be apparent from the following description, the drawings.

DETAILED DESCRIPTION OF PREFERRED EMBODIMENTS

Figure 1:
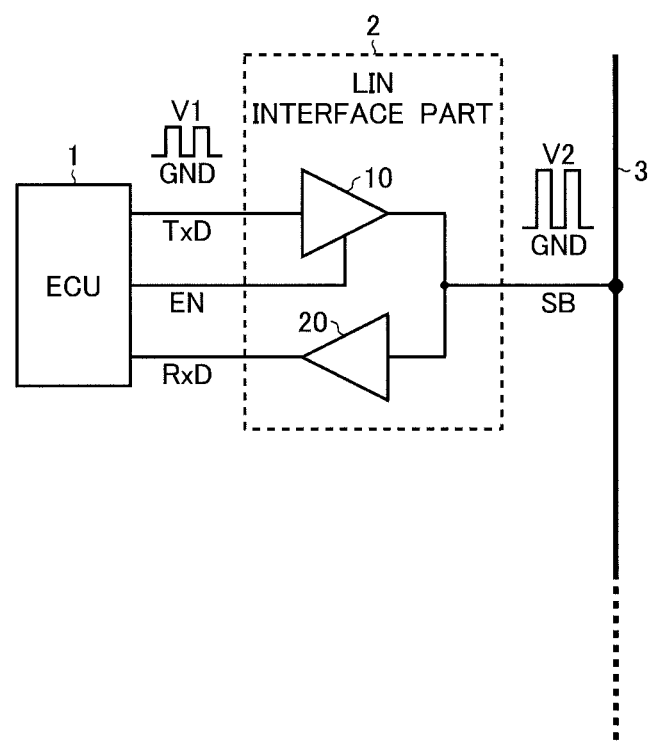
FIG. 1 is a block diagram showing a construction example of a car mounted communication system.

FIG. 1 is a block diagram showing a construction example of a car mounted communication system. The car mounted communication system shown in this diagram includes an ECU (Electronic Control Unit) 1, a LIN (Local Interconnect Network) interface part 2, and a LIN bus 3.

The ECU 1 is a microcomputer unit to control devices mounted on a car. The ECU 1 connected to the LIN bus 3 is embedded in a device (e.g., a manipulating part, a driver for a door mirror, a driver for a power window, and so on) which does not require a high speed response.

The LIN interface part 2 is an interface device to control a two way communication between the ECU 1 and the LIN bus 3, and includes a transmitter 10 and a receiver 20. The transmitter 10 is formed on a signal transmission path from the ECU 1 to the LIN bus 3. The transmission data TxD is provided to the transmitter 10, and the transmitter 10 provides a bus signal SB to the LIN bus 3. The receiver 20 is formed on a signal reception path from the LIN bus 3 to the ECU 1. The bus signal SB is provided to the receiver 20, and the receiver 20 provides receiving data RxD. The construction and operation of the transmitter 10 and the receiver 20 are described in more detail later.

When the bus signal SB is provided to LIN bus 3, an enable control signal EN provided from the ECU 1 to the transmitter 10 is converted to a logic level of permission for an output from the transmitter 10, and the output stage of the transmitter 10 becomes a state of permission for the output. When the bus signal SB is provided from the LIN bus 3, the enable control signal EN is converted to a logic level of prohibition for the output from the transmitter 10, and the output stage of the transmitter 10 becomes a state of prohibition for the output (i.e., high impedance state).

In a typical implementation, as for the transmission data TxD and the receiving data RxD used for the ECU 1 (ECU1 is driven at 3V or 5V), a high level of the signals equals to an ECU side power source voltage V1, and a low level of the signals equals to a ground voltage. Both of the signals are small amplitude signals (e.g., LVTTL [Low Voltage Transistor Transistor Logic] signal the high level of which is smaller than 2V and the low level of which is smaller than 0.8V). On the other hand, as for the bus signal SB, a high level of the signal equals to a bus side power source voltage V2 (e.g., 5V to 27V), and a low level of the signal equals to a ground voltage, which is a large amplitude signal. Thus a level shifter function is provided in the transmitter 10 and the receiver 20. A slew rate control function is provided in the transmitter 10.

The LIN bus 3 is a low cost serial signal transmission line used for a car mounted communication network (LIN) which does not require a broad bandwidth or various purposes compared to functions of a CAN (Controller Are Network) or a FlexRay. As for the LIN bus 3, a master-slave control technique is used. A LIN master and a LIN slave (or slaves) are used for the master-slave control technique. A transmission rate of a bus signal SB communicated via the LIN bus 3 is low (20 kb/s at most).

Figure 2:
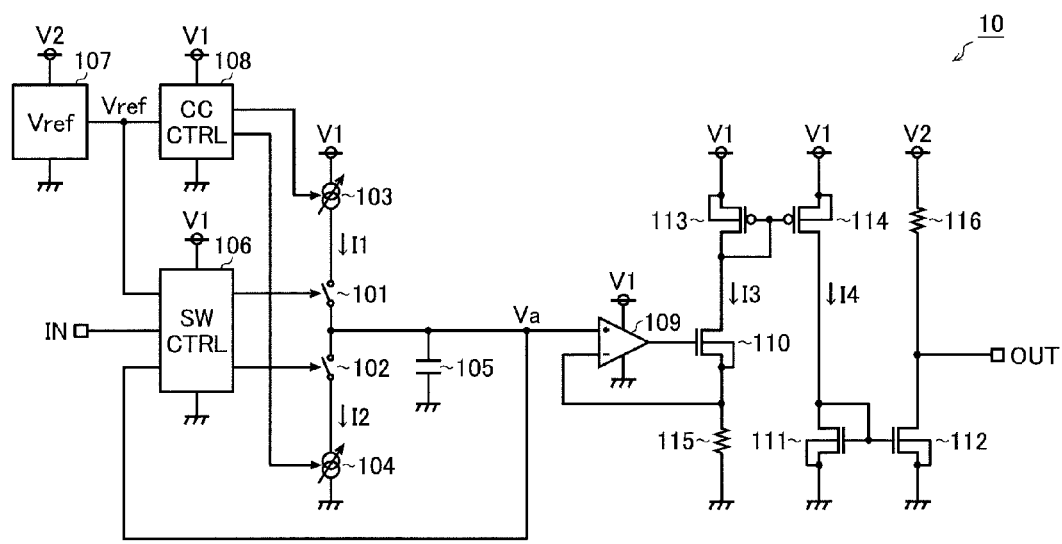
FIG. 2 is a circuit diagram showing a schematic construction of a transmitter 10.

A transmitter 10 shown in FIG. 2 includes, switches 101 and 102, constant current sources 103 and 104, a capacitor 105, a switching controller 106, a reference voltage generator 107, a constant current controller 108, an amplifier 109, NMOS FETs 110 to 112, PMOS FETs 113 and 114, and resistors 115 and 116.

The switch 101 conducts or cuts off a connection node between the capacitor 105 and the constant current source 103 based on a instruction from the switching controller 106. The switch 102 conducts or cuts off a connection node between the capacitor 105 and the constant current source 104 based on a instruction from the switching controller 106.

The constant current source 103 generates a charge current I1 for the capacitor 105. One end of the constant current source 103 is connected to a voltage supplying terminal of the ECU side supply voltage V1, and the other end of the constant current source 103 is connected to the switch 101. The constant current source 104 generates a discharge current I2 for the capacitor 105. One end of the constant current source 104 is connected to the switch 102, and the other end of the constant current source 104 is connected to a ground terminal. A charged voltage Va is derived (provided) from one end (a high potential side) of the capacitor 105.

The switching controller 106 operates in response to input of the ECU side power source voltage V1, and performs ON-OFF control of the switches 101 and 102 in response to a logic level of a transmission input signal IN (IN equivalents to the transmission data TxD shown in FIG. 1), and in response to a comparison result between the charge voltage Va and a reference voltage Vref. When the switch 101 is turned ON and the switch 102 is turned OFF, the charge current I1 flows into the capacitor 105. When the switch 101 is turned OFF and the switch 102 is turned ON, the discharge current I2 is derived (provided) from the capacitor 105. When the charge voltage Va is charged to the capacitor 105, if the switches 101 and 102 are turned OFF, then the charge voltage Va of the capacitor 105 is maintained as a constant value. Thus, the charge/discharge controller is formed that controls the charging and discharging of the capacitor 105 with the switches 101 and 102 and the switching controller 106. The operation and construction of the charge/discharge controller (101, 102, and 106) are described later.

The reference voltage generator 107 controls the reference voltage Vref depend on the bus side power source voltage V2. The constant current controller 108 operates in response to input of the ECU side power source voltage V1, and controls current values of the charge current I1 and the discharge current I2. The operation and construction of the reference voltage generator 107 and the constant current controller 108 are described later.

The amplifier 109, the transistors 110 to 114, and the resistors 115 and 116 are circuit elements constructing an output stage of the transmitter 10. A non-inverting input terminal (+) of the amplifier 109 is connected to a voltage supplying terminal (a high potential terminal of the capacitor 105) that supplies the charge voltage Va. An inverting input terminal (−) is connected to a first terminal of the resistor 115. An output of the amplifier 109 is connected to a gate terminal of the transistor 110. An upper side power source terminal of the amplifier 109 is connected to the ECU side power source voltage V1. A lower side power source terminal of the amplifier 109 is connected to a ground terminal. Both a source terminal of the transistor 110 and a back gate of the transistor 110 are connected to the first terminal of the resistor 115. A second terminal of the resistor 115 is connected to a ground terminal. A drain terminal of the transistor 110 is connected to a drain terminal of the transistor 113. Both a source terminal of the transistor 113 and a back gate of the transistor 113 are connected to the ECU side power source voltage V1. Both a source terminal of the transistor 114 and a back gate of the transistor 114 are connected to the ECU side power source voltage V1. Both a gate terminal of the transistor 113 and a gate terminal of the transistor 114 are connected to a source terminal of the transistor 113. A drain terminal of the transistor 114 is connected to a drain terminal of the transistor 111. Both of a source terminal of the transistor 111 and a source terminal of the transistor 112 are connected to a ground terminal. Both a back gate of the transistor 111 and a back gate of the transistor 112 are connected to a ground terminal. Both gate terminals of the transistors 111 and 112 are connected to a source terminal of the transistor 111. A drain terminal of the transistor 112 is connected to an output terminal from which the transmission output signal OUT is provided. A drain terminal of the transistor 112 is connected to the bus side power source voltage V2 via the resistor 116.

Feedback control on a gate signal of the transistor 110 is implemented by the amplifier 109 to equalize a voltage supplied to a first terminal of the resister 115 (a resistance value=R115) with the charge voltage Va. Thus, a current I3 flowing through the transistor 113 is adjusted to be a current value (a maximum current value=Vref/R115) commensurate with the charge current Va. The transistors 113 and 114 form a current mirror circuit (a mirror ratio=1:1), the current I3 is reproduced as the current I4 which flows through the transistor 114. Thus also the current I4 becomes a current value (a maximum current value=Vref/R115) commensurate with the charge voltage Va. The transistors 111 and 112 form a current mirror circuit (a mirror ratio=1:1), a gate voltage of the transistor 112 is controlled in response to a current value of the current I4. Thus, If a current value of the current I4 increases, then a gate voltage of the transistor 112 increases, and the conduction level of the transistor 112 becomes higher. Thus, the transistor 112 is an open-drain transistor, a conduction level of which is controlled according to the charge voltage Va. A slew rate of the transmission output signal OUT, which is provided from a drain terminal of the transistor 112, is set according to the charge voltage Va. An amplitude of the transmission output signal OUT is set according to the bus side power source voltage V2.

Figure 3:
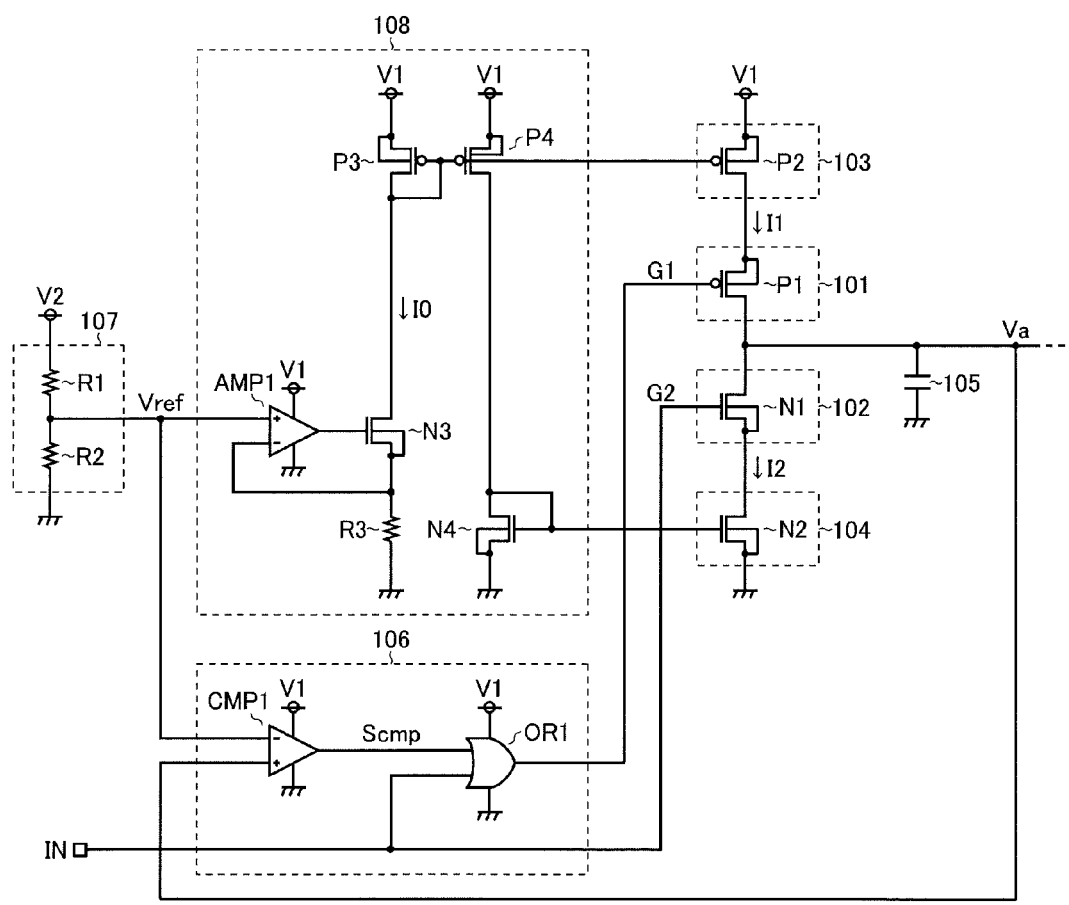
FIG. 3 is a circuit diagram showing a concrete construction of a front end of the transmitter 10.

FIG. 3 is a circuit diagram showing a concrete construction of the transmitter 10 (a generator of the charge voltage Va formed at a front end).

A PMOS FET P1 is used as the switch 101. A NMOS FET N1 is used as the switch 102. A PMOS FET P2 is used as the constant current source 103. A NMOS FET N2 is used as the constant current source 104.

A source terminal and a back gate of the transistor P1 are connected to a drain terminal of the transistor P2. A source of the transistor P2 is connected to the ECU side power source voltage V1. A back gate of the transistor P2 is connected to the ECU side power source voltage V1. Both drain terminals of the transistor P1 and the transistor N1 are connected to a voltage supplying terminal of the charge voltage Va. Both a source of the transistor N1 and a back gate of the transistor N1 are connected to a drain terminal of the transistor N2. Both a source terminal and a back gate of the transistor N2 are connected to a ground terminal.

The switching controller 106 includes a comparator CMP1 and a logical sum operation circuit OR1. A non-inverting input terminal (+) of the comparator CMP1 is connected to a voltage supplying terminal of the charge voltage Va. An inverting input terminal (−) of the comparator CMP1 is connected to a voltage supplying terminal of the reference voltage Vref. An upper side power source terminal of the comparator CMP1 is connected to a voltage supplying terminal of the ECU side power source voltage V1. A lower side power source terminal of the comparator CMP1 is connected to a ground terminal. A first input terminal of the logical sum operation circuit OR is connected to an output terminal of the comparator CMP1. A second input terminal of the logical sum operation circuit OR is connected to an input terminal of the transmission input signal IN. The input terminal of the transmission input signal IN is also connected to a gate terminal of the transistor N1. An output terminal of the logical sum operation circuit OR1 is connected to a gate terminal of the transistor P1. An upper side power source terminal of the logical sum operation circuit OR1 is connected to the ECU side power source voltage V1. A lower side power source terminal of the logical sum operation circuit OR1 is connected to a ground terminal.

The reference voltage generator 107 includes a resistor R1 and a resistor R2, and both resisters are connected serially between the bus side power source voltage V2 and a ground terminal, and the reference voltage Vref is derived (provided) from a connection node of the resistors. The bus side power source voltage V2 is divided by a predetermined ratio $\alpha$ with a resistor ladder, from which the reference voltage Vref is generated. A ratio $\alpha$ (e.g., $\alpha=\frac{1}{2}$) is set based on a calculation of dividing R2 by R1+R2, thus Vref is set based on a calculation of multiplication a by V2. Thus the reference voltage Vref ($=\alpha*V2$) is controlled easily depend on (commensurate with) the bus side power source voltage V2.

The constant current controller 108 includes an amplifier AMP1, NMOS FETs N3 and N4, PMOS FETs P3 and P4, and a resistor R3. A non-inverting input terminal (+) of the amplifier AMP1 is connected to a voltage supplying terminal of the reference voltage Vref. An inverting input terminal (−) of the amplifier AMP1 is connected to a first end of the resistor R3. An output terminal of the amplifier AMP1 is connected to a gate terminal of the transistor N3. An upper side power source terminal of the amplifier AMP1 is connected to an input terminal of the ECU side power source voltage V1. A lower side power source terminal of the amplifier AMP1 is connected to a ground terminal. Both a source terminal of the transistor N3 and a back gate of the transistor N3 are connected to the first end of the resistor R3. A second end of the resistor R3 is connected to a ground terminal. A drain terminal of the transistor N3 is connected to a drain terminal of the transistor P3. Both a source terminal and a back gate of the transistor P3 are connected to the ECU side power source voltage V1. Both a source terminal and a back gate of the transistor P4 are connected to the ECU side power source voltage V1. Each of gate terminals of the transistors P2 to P4 are connected to a source terminal of the transistor N3. A drain terminal of the transistor P4 is connected to a drain terminal of the transistor N4. Both a source terminal and a back gate of the transistor N4 are connected to a ground terminal. Both a gate terminal of the transistor N2 and a gate terminal of the transistor N4 are connected to a source terminal of the transistor N4.

A feedback control on a gate signal of the transistor N3 is operated by the amplifier AMP1, to equalize a voltage supplied to the first end of the resister R3 with the reference voltage Vref. Thus, a reference current I0 flowing through the transistor P3 is adjusted to be a current value I ($I=Vref/R3=(a*V2)/R3$) which commensurate with the reference voltage Vref. The transistors P2 and P3 form a current mirror circuit (a mirror ratio=1:1), the reference current I0 is reproduced as the charge current I1 which flows through the transistor P2. The transistors P3 and P4 form a current mirror circuit (a mirror ratio=1:1), and the transistors N2 and N4 form a current mirror circuit (mirror ratio=1:1). The reference current I0 is reproduced as the discharge current I2 which flows the transistor N2.

Thus, the constant current controller 108 includes a reference current generator (AMP1 and N3 and R3) which converts the reference voltage Vref to the reference current I0 based on a conversion from a voltage to a current. The constant current controller 108 also includes a current mirror circuit (P3 and P4 and N4) which reproduces the reference current I0 and generates the charge current I1 and the discharge current I2.

Figure 4:
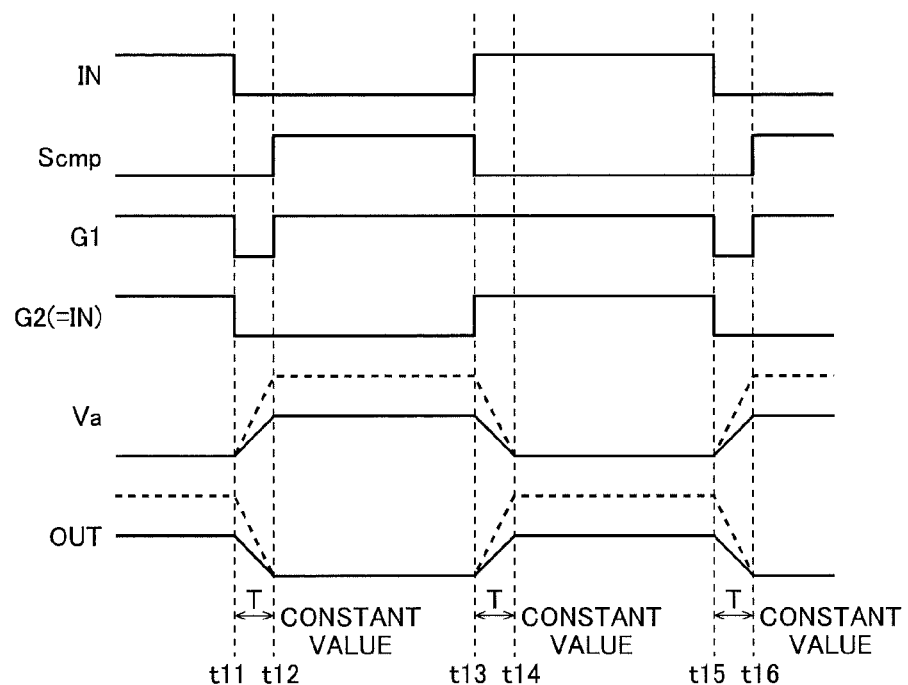
FIG. 4 is a signal waveform diagram to explain an operation of the transmitter 10.

FIG. 4 is a signal waveform diagram to explain an operation of the transmitter 10 (formed with constructions shown in FIG. 2 and FIG. 3), a transmission input signal IN, a comparison signal Scmp of the comparator CMP1, a gate signal G1 of the transistor P1, a gate signal G2 of the transistor N1, a charge current Va, and a transmission output signal OUT are shown in order.

The transmission input signal IN is maintained at a high level before time t11, and the output signal OUT is maintained at a high level (=the bus side power source voltage V2).

At time t11, the transmission input signal IN changes to a low level from a high level, then both gate signals G1 and G2 changes to a low level. As a result, the transistor P1 is turned ON, and the transistor N1 is turned OFF. Based on this switching control, the charge current I1 (current value=+I) flows into the capacitor 105 (capacitance=C) from the transistor P2 via the transistor P1. As a result, the charge current Va derived (provided) from one end (high potential side) of the capacitor 105 begins to rise at a constant slew rate SR1. The slew rate SR1 (=+I/C[V/S]) is based on a current value of the charge current I1 and a capacitance of the capacitor 105. At this time, the charge voltage Va does not reach the reference voltage Vref, the comparison signal Scmp is maintained at a low level. As for currents I3 and I4 flowing through an output stage, both currents have a current value commensurate with the charge voltage Va, and the conduction level of the transistor 112 becomes higher according to a rising of the charge voltage Va, the transmission output signal OUT begins to fall from a high level (=the bus side power source voltage V2) at a constant slew rate SR3. Thus, a slew rate SR3 at the time of the falling of the transmission output signal OUT is set according to the charge voltage Va.

Then, at time t12, when the charge voltage Va reaches the reference voltage Vref, the comparison signal Scmp changes to a high level from a low level. A gate signal G1 provided from the logical sum operation circuit OR1 changes to a high level regardless of the logic level of the transmission input signal IN. As a result, the transistor P1 is turned OFF, and the charge voltage Va is maintained at the reference voltage Vref by the capacitor 105. It is desirable for the comparator CMP1 to have a hysteresis characteristic, to maintain a logic level of the comparison signal Scmp stable. Also at time t12, the transmission output signal OUT falls at a low level (=almost 0V).

At time t13, when the transmission input signal IN is raised to a high level from a low level, both gate signals G1 and G2 are raised to a high level (i.e., the gate signal G1 is a high level before time t13). As a result, the transistor P1 is maintained at OFF state, and the transistor N1 is turned ON. According to thus switching control, the discharge current I2 (a current value=–I) is provided from the capacitor 105 to the transistor N2 via the transistor N1. As a result, the charge voltage Va begins to fall at a constant slew rate SR2. The slew rate SR2 (=–I/C[V/S]) is based on a current value of the discharge current I2 and a capacitance of the capacitor 105. At this time a comparison signal Scmp is changed from a high level to a low level. A conduction level of the transistor 112 is getting lower in accordance with the charge voltage Va, and the transmission output signal OUT begins to rise from a low level at a constant slew rate SR4. The slew rate SR4 is set based on the charge voltage Va.

Then, at time t14, a conduction level of the transistor 112 constructing an output stage becomes zero, and the transmission output signal OUT reaches a high level (i.e., the bus side power source voltage V2). At this time, the capacitance of the capacitor 105 is discharged completely, and the charge voltage Va is 0V. This state is same as before time t11. If the transmission input signal IN is changed from a high level to a low level at time t15, the same operation is repeated as described above.

The reference voltage Vref is adjusted depend on the bus side power source voltage V2, and the reference current I0 (furthermore the charge current I1 and the discharge current I2) is adjusted depend on the reference voltage Vref (furthermore the bus side power source voltage V2). Thus, both slew rates SR1 and SR2 (furthermore both slew rates SR3 and SR4 for transmission output signal OUT) of the charge voltage Va has dependence characteristic to V2. This dependence characteristic can be confirmed by referring to the comparison between the full line and the dashed line in FIG. 4.

Thus construction makes it possible to cancel out dependence characteristic to V2 for both the reference voltage Vref and the reference current I0 (furthermore the charge current I1 and the discharge current I2). Thus, if the bus side power source voltage V2 (a signal amplitude of the transmission output signal OUT) fluctuates widely in accordance with a charging situation or driving situation for a car mounted device, both rise time T and fall time T (T=C*Vref/I=C*R3) for the charge voltage Va (furthermore a transmission output signal OUT) are maintained at a constant value. Thus, fluctuations of a duty between the transmission input signal IN and the transmission output signal OUT, is reduced.

A construction described above makes it possible to set both rise time T and fall time T easily based on the above mentioned calculation (T=C*Vref/I=C*R3). For example, if it is desired to set both rise time T and fall time T as relatively long time, both slew rates SR1 and SR2 for the charge voltage Va should be set at a small value. Accordingly, the reference current I0 should be reduced based on an enlargement of a resistance of the resistor R3, or a capacitance value C of the capacitor 105 should be enlarged. If it is desired to set both rise time T and fall time T as relatively short time, both slew rates SR1 and SR2 for the charge voltage Va should be set at a large value. Accordingly, the reference current I0 should be enlarged based on a reduction of a resistance of the resistor R3, or based on a reduction of a capacitance value C of the capacitor 105.

Above mentioned LIN interface 2 with a slew rate control function is used widely regardless of the bus side power source voltage V2 which varies depend on a kind of a car. Thus both productivity of the LIN interface 2 or a car mounted device using the LIN interface 2 are increased, and cost down is realized.

Above mentioned slew rate control technique is useful to enhance reliability not only for the illustrated car mounted communication system, but also for general applications which require duty accuracy.

Figure 5:
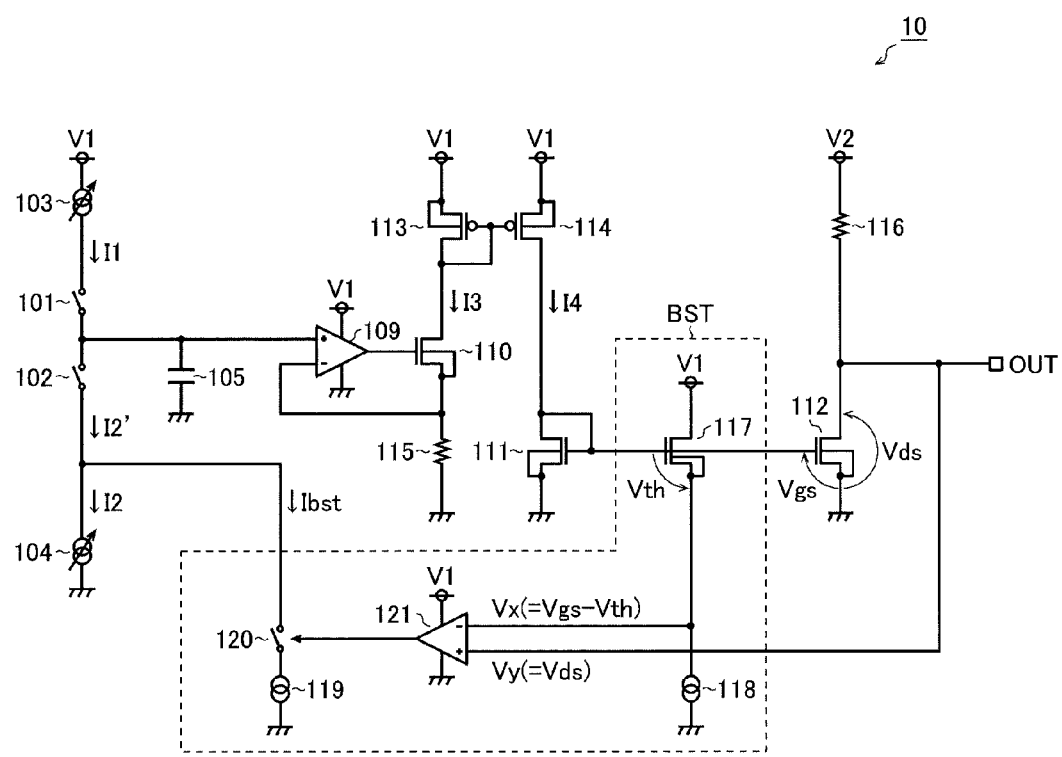
FIG. 5 is a circuit diagram showing another example of a back end of the transmitter 10.
Figure 6:
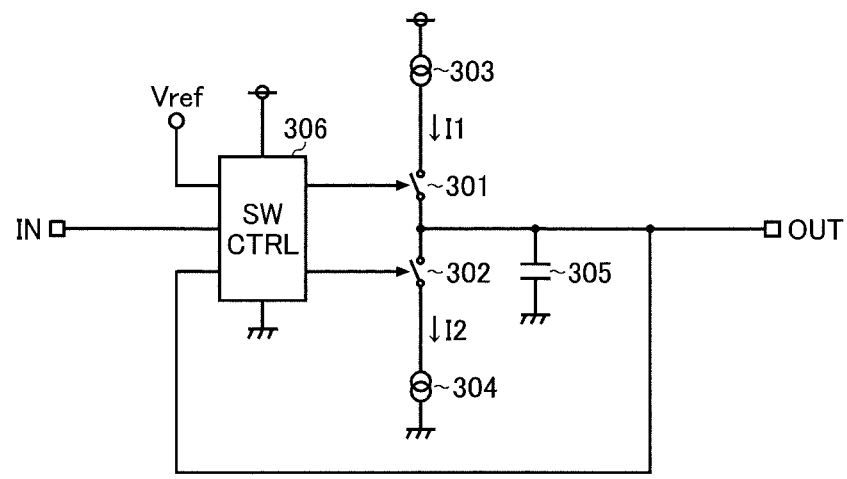
FIG. 6 is a circuit diagram showing a transmitter having a slew rate control function in accordance with the related art.
Figure 7:
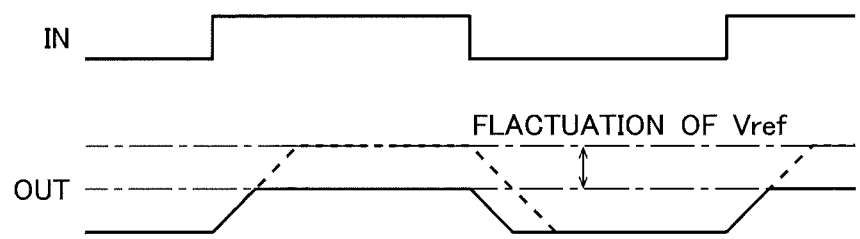
FIG. 7 is a signal waveform diagram to explain fluctuations of a duty.

Another example of the transmitter 10 is described with reference to FIG. 5 below. FIG. 5 is a circuit diagram showing another example of a back end of the transmitter 10.

As for LIN standard, three kinds of load (500Ω/10 nF, 660Ω/6.8 nF, 1000Ω/1 nF) can be connected. However, if a characteristic of a load connected to the LIN bus 3 changes, there is a possibility of an unintentional fluctuation of both slew rates SR3 and SR4 for the transmission output signal OUT generated by the transmitter 10. If a load is relatively large, a rise of the transmission output signal OUT slows down.

The transmitter 10 of this example adds a boost current Ibst to the discharge current I2 until the open-drain transistor 112 becomes a state which operates in its saturation region. If the open-drain transistor 112 becomes a state which operates in its saturation region, the boost current Ibst is stopped. In other words, if the drain-source voltage Vds of the transistor 112 exceeds a value based on a subtraction of an on threshold voltage Vth of the transistor 112 from the gate-source voltage Vgs of the transistor 112, the boost current Ibst is stopped. To generate and stop the boost current Ibst, the transmitter 10 further includes the booster BST.

The booster BST includes NMOS FET 117, constant current sources 118 and 119, a switch 120, and a comparator 121.

The transistor 117 is a monitor transistor designed by a same manufacturing process to the transistor 112, to possess an on threshold voltage Vth same as the transistor 112. The constant current source 118 generates a small current to the transistor 112 (e.g., 100 nA). The constant current source 119 generates the boost current Ibst. The switch 120 conducts or cuts off a current channel where the boost current Ibst flows through. The comparator 121 compares a voltage signal Vx (=Vgs−Vth) derived from a source terminal of the transistor 117 with a voltage signal Vy (=Vds) derived from a drain terminal of the transistor 112, then performs the ON-OFF control of the switch 120 based on the result of the comparison.

Connection relationship for circuit elements is described below. A drain terminal of the transistor 117 is connected to the ECU side power source voltage V1. Both a source terminal and a back gate of the transistor 117 are connected to an inverting input terminal (−) of the comparator 121 and a first terminal of the constant current source 118. A gate terminal of the transistor 117 is connected to a drain terminal of the transistor 111. Both gate terminals of the transistors 111 and 112 are connected to a drain terminal of the transistor 111. A second terminal of the constant current source 118 is connected to a ground terminal. A non-inverting input terminal (+) of the comparator 121 is connected to a drain terminal (i.e., an output terminal of the transmission output signal OUT) of the transistor 112. An output terminal of the comparator 121 is connected to a control terminal of the switch 120. An upper source terminal of the comparator 121 is connected to the ECU side power source voltage V1. A lower source terminal of the comparator 121 is connected to a ground terminal. A first terminal of the switch 120 is connected to a connection node between the switch 102 and the constant current source 104. A second terminal of the switch 120 is connected to a first terminal of the constant current source 118. A second terminal of the constant current source 118 is connected to a ground terminal.

As for the booster BST described above, a gate-source voltage Vgs of the transistor 112 is supplied to a gate terminal of the transistor 117. As described above, the transistor 117 is designed by a same manufacturing process to the transistor 112 to possess an on threshold voltage Vth same as the transistor 112. Thus, if the transistors 112 and 117 are turned ON, the voltage signal Vx derived from a drain terminal of the transistor 117 becomes a value based on a subtraction of an ON threshold voltage Vth of the transistor 112 from a gate-source voltage Vgs of the transistor 112. On the other hand, the voltage signal Vy derived from a drain terminal of the transistor 112 equivalents to a drain-source voltage Vds of the transistor 112. Thus, the comparator 121 compares the Vds with "Vgs-Vth", furthermore judging whether the transistor 112 becomes a state which operates in its saturation region or not.

Thus, a discharge of the capacitor 105 is performed by a boost discharge current I2' which is sum of the discharge current I2 and the boost current Ibst, until the transistor 112 becomes a state which operates in its saturation region. When the transistor 112 becomes a state which operates in its saturation region, an ON-OFF control of the switch 120 is performed according to an output of the comparator 121 to stop the boost current Ibst. Thus, even if a large load is connected to the LIN bus 3, the transmission output signal OUT (the bus signal SB) does not slow down. Therefore a desired slew rate can be maintained.

Figure 8:
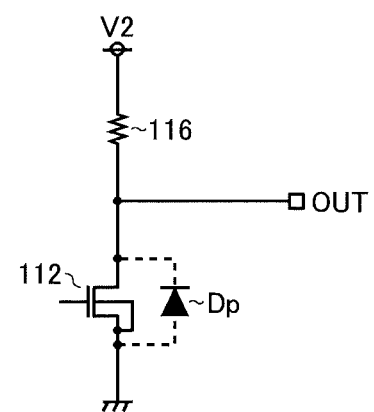
FIG. 8 is a circuit diagram showing a first construction example of an open-drain output stage.

FIG. 8 is a circuit diagram showing a first construction example of an open-drain output stage, an output stage including an open-drain transistor described in FIG. 2 and FIG. 5 are described again. As shown in FIG. 8, a parasitic diode Dp is accompanied between a drain terminal and a source terminal of the transistor 112. Therefore, if a surge voltage of a negative potential is supplied to an output terminal of the transmission output signal OUT, a large current flows through in a route from a ground terminal to the parasitic diode Dp. Therefore, there is a possibility of a breakdown of the transistor 112.

Figure 9:
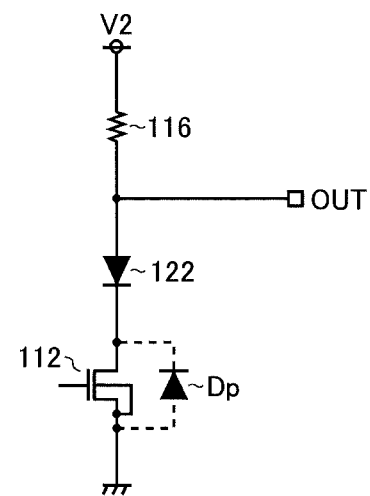
FIG. 9 is a circuit diagram showing a second construction example of an open-drain output stage.

FIG. 9 is a circuit diagram showing a second construction example of an open-drain output stage. To enhance a tolerance against above mentioned surge voltage of a negative potential, as for an open-drain output stage of the second construction example includes a diode 122. An anode terminal of the diode 122 is connected to an output terminal of the transmission output signal OUT. A cathode terminal of the diode 122 is connected to a drain terminal of the transistor 112. If a surge voltage of a negative potential is supplied to an output terminal of the transmission output signal OUT, this construction makes it possible to cut off a current flowing through from a ground terminal to the parasitic diode Dp by the diode 122, a state of which is reverse bias. Therefore, a large current of a forward direction flowing through a parasitic diode Dp is prevented, and a breakdown of the transistor 112 can be prevented.

If a SOI (Silicon On Insulator) process is used for a manufacturing process of a semiconductor, an epitaxial film formation layer to form a circuit and a semiconductor substrate (GND) is separated completely by an intermediate insulating layer, above mentioned diode 122 is manufactured easily. However, if a commonly used CMOS process or a BiCMOS process is used for manufacturing a semiconductor, a breakdown voltage performance caused by the diode 122 is not exerted at full, because of a parasitic element accompanied between a semiconductor substrate and the diode 122. Therefore, to resolve such a problem, a construction of the diode 122 has to be designed deliberately.

Figure 10:
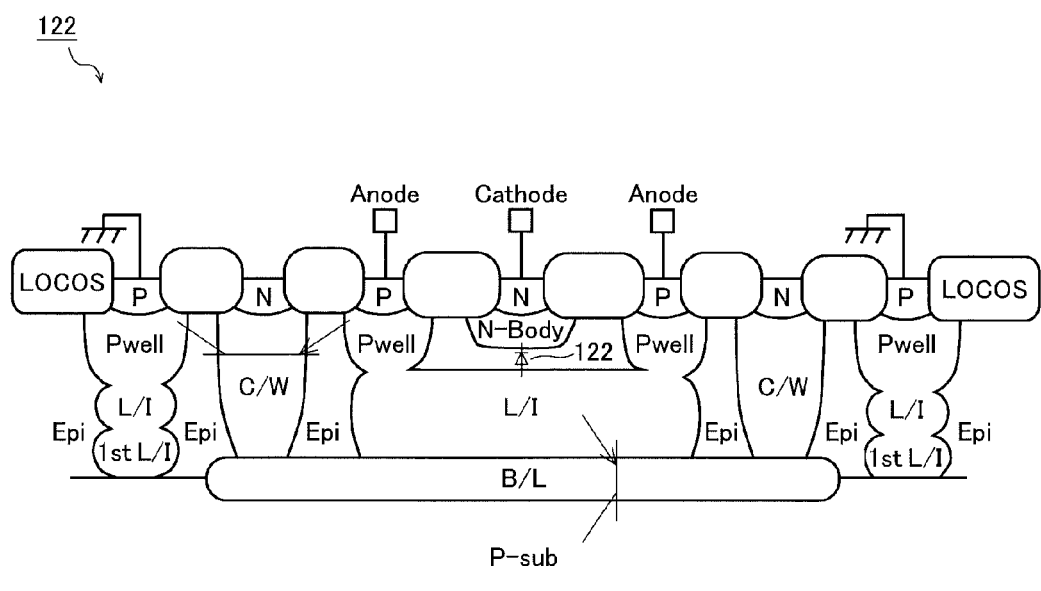
FIG. 10 is a vertical cross section diagram showing a pattern construction of a diode 122.

FIG. 10 is a vertical cross section diagram showing a pattern construction of a diode 122. The diode 122 of this example is formed in a floating region surrounded by an embedded insulating layer B/L [Burried Layer] of n+ type formed on a region of a semiconductor substrate P-sub of P− type, and surrounded by a collector wall C/W (n− type) formed on around the upper part of the embedded insulating layer B/L. This construction makes it possible to separate the diode 122 from the semiconductor substrate P-sub electrically, a parasitic element is prevented between the semiconductor substrate P-sub and the diode 122. Thus, the diode 122 makes it possible to exert a breakdown voltage performance at full.

An explanation about symbols described in FIG. 10 is described below. L/I and 1stLI stand for a P− type low insulating layer (Low Isolation). The symbol Epi stands for a n− type epitaxial film formation layer. The symbol Pwell stands for a p+ type well region. The symbol NBody stands for a n+ type body region.

Figure 11:
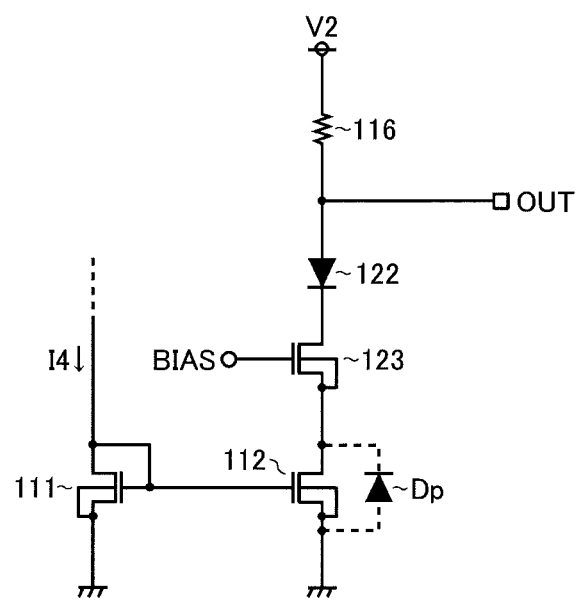
FIG. 11 is a circuit diagram showing a third construction example of an open-drain output stage.

FIG. 11 shows a third construction example of an open-drain output stage. A negative potential breakdown voltage of the open-drain output stage can be enhanced by inserting the diode 122 described in FIG. 9. However, if a positive potential voltage is provided to an output terminal of the transmission output signal OUT, the diode 122 becomes a state of a positive bias. Therefore, if a breakdown voltage between a drain terminal and a source terminal of the transistor 112 is not designed to a high voltage, the transistor 112 can be broken. However, in the open-drain output stage manufactured by CMOS process, if only the transistor 112 is manufactured by DMOS process (a high breakdown voltage process), a coupling characteristic between the transistor 111 and the transistor 112 forming a current mirror circuit becomes worse, then the slew rate control becomes hard to control.

Therefore, an open-drain output stage of the third construction example includes a NMOS FET 123 manufactured by DMOS process. The NMOS FET 123 is formed between a drain terminal of the transistor 112 manufactured by a CMOS process and a cathode terminal of the diode 122 manufactured by a CMOS process. Thus, as for an open-drain output stage of this third construction example, to enhance a positive potential breakdown voltage, the transistor 123 whose breakdown voltage between a drain terminal and a source terminal is a high voltage, can be used as a source follower. This construction makes it possible to enhance a positive potential breakdown voltage of an open-drain output stage using the transistor 112 manufactured by commonly used CMOS process.

A bias voltage BIAS (BIAS is greater than or equal to [VgsC−VthC+VgsD]) to operate the transistor 112 in its saturation region is provided to a gate transistor of the transistor 123. The parameter VgsC stands for a voltage between a gate terminal and a source terminal of the transistor 112. The parameter VthC stands for an ON threshold voltage of the transistor 112. The parameter VgsD stands for a voltage between a gate terminal and a source terminal of the transistor 123. Thus providing a bias voltage BIAS makes it possible to operate the transistor 112 in its saturation region regardless of a state of a load connected to a LIN bus 3, then the booster BST shown in FIG. 5 can be removed.

To realize constructions shown in FIG. 9 to FIG. 11, as for a semiconductor manufacturing process, a BiCDMOS process which is superior to a SOI process in terms of a cost can be used. Thus, without using a costly SOI process, an open-drain output stage, the breakdown voltage of which is relatively higher against a positive potential serge and a negative potential serge, can be realized.

A high breakdown voltage (e.g., −27V to 40V) in both positive and negative directions is required for LIN interface 2. Using the above mentioned open-drain output stage typically meets such requirements.

The above mentioned technique to enhance a breakdown voltage is used for a car mounted communication system, and also used for a common open-drain output stage which requires a high breakdown voltage.

Figure 12:
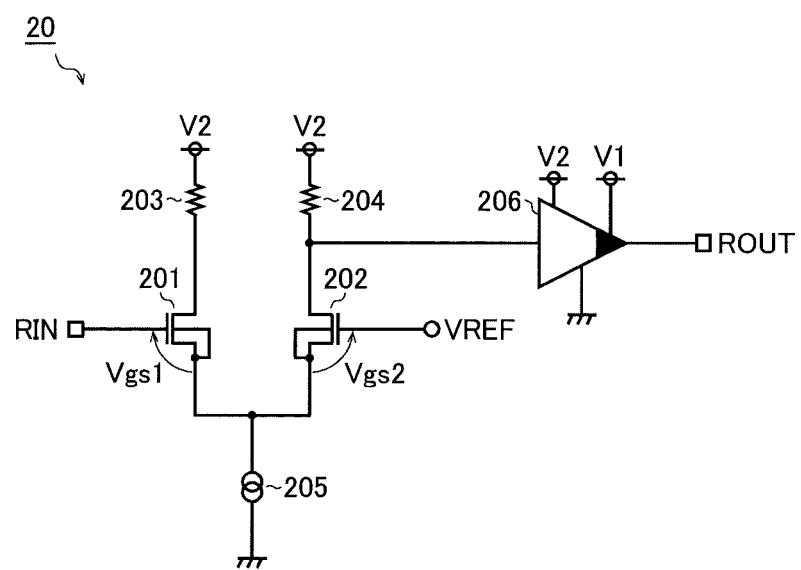
FIG. 12 is a circuit diagram showing a first construction example of a receiver 20.

FIG. 12 is a circuit diagram showing a first construction example of a receiver 20. As shown in FIG. 12, the receiver 20 includes NMOS FET transistor 201 and 202, resistors 203 and 204, a constant current source 205, and a level shifter 206.

A drain terminal of the transistor 201 is connected to the bus side power source voltage V2 via the resistor 203. A drain terminal of the transistor 202 is connected to the bus side power source voltage V2 via the resistor 204. A source terminal and a back gate of the transistor 201 are connected to a ground terminal via the constant current source 205. A source terminal and a back gate of the transistor 202 are connected to a ground terminal via the constant current source 205. A gate terminal of the transistor 201 is connected to an input terminal of a receiving input signal RIN (RIN equivalents to the bus signal SB in FIG. 1). A gate terminal of the transistor 202 is connected to an input terminal of a receiving reference voltage VREF. An input terminal of the level shifter 206 is connected to a drain terminal of the transistor 202. An output terminal of the level shifter 206 is connected to an output terminal of a receiving output signal ROUT (ROUT equivalents to the reception data RxD in FIG. 1).

The level shifter 206 receives the input of the voltage signal (a large amplitude signal, a high level of which is bus side power source voltage V2, and a low level of which is a ground voltage) derived from a drain terminal of the transistor 202, and converts this into a receiving output signal ROUT (a small amplitude signal, a high level of which is ECU side power supply V1, and a low level of which is a ground voltage).

However, as for the receiver 20 of the first construction example, if the receiving input signal RIN becomes the bus side power source voltage V2, a source voltage [V2−Vgs1] (i.e., A voltage based on a subtraction of a gate-source voltage Vgs1 from the bus side power source voltage V2) appears at both source terminals of the transistors 201 and 202. Then a gate-source voltage [V2−Vgs1−VREF] (i.e., A voltage based on a subtraction of the receiving reference voltage VREF from the source voltage [V2−Vgs1]) is supplied as a gate-source voltage of the transistor 202. If the gate-source voltage [V2−Vgs1−VREF] exceeds a gate-source breakdown voltage of the transistor 202, the transistor 202 can be broken.

Figure 13:
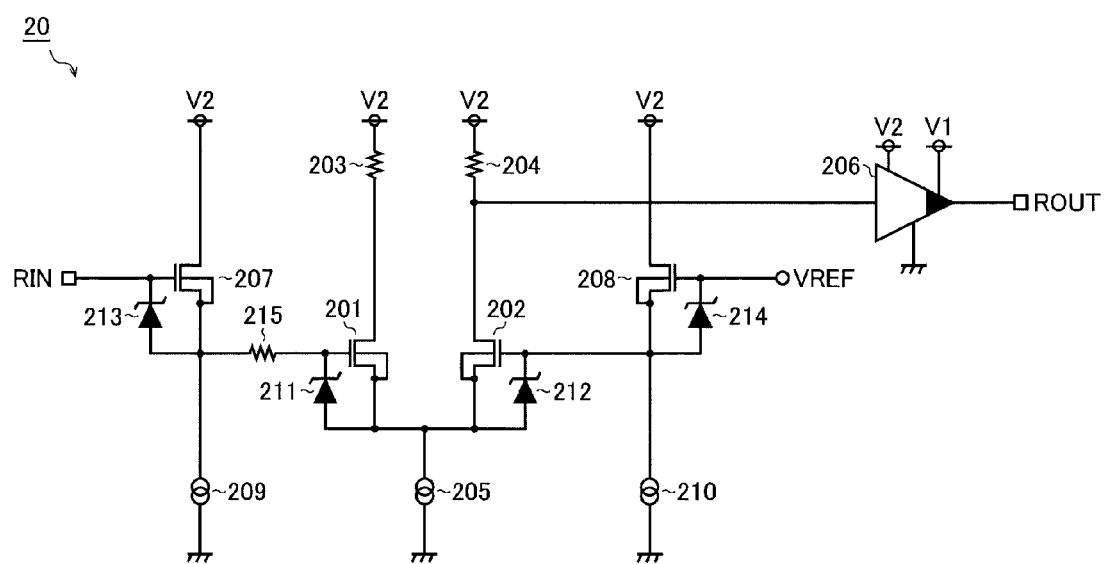
FIG. 13 is a circuit diagram showing a second construction example of the receiver 20.

FIG. 13 is a circuit diagram showing a second construction example of the receiver 20. The receiver 20 of the second construction example includes, NMOS FETs 207 and 208, constant current sources 209 and 210, zener diodes 211 to 214, and a resistor 215 in addition to circuit elements 201 to 206 of the first construction example.

A drain of the transistor 207 is connected to a voltage supplying terminal of the bus side power source voltage V2. A source terminal and a back gate of the transistor 207 are connected to a ground terminal via the constant current source 209, and also connected to a gate terminal of the transistor 201 via the resistor 215. A gate terminal of the transistor 207 is connected to an input terminal of a receiving input signal RIN, instead of a gate terminal of the transistor 201. A drain terminal of the transistor 208 is connected to a voltage supplying terminal of the bus side power source voltage V2. A source terminal and a back gate of the transistor 208 are connected to a ground terminal via the constant current source 210, and also connected to a gate terminal of the transistor 202. A gate terminal of the transistor 208 is connected to an input terminal of the receiving reference voltage VREF, instead of a gate terminal of the transistor 202.

A cathode terminal of the zener diode 211 is connected to a gate terminal of the transistor 201. An anode terminal of the zener diode 211 is connected to a source terminal of the transistor 201. A cathode terminal of the zener diode 212 is connected to a gate terminal of the transistor 202. An anode terminal of the zener diode 212 is connected to a source terminal of the transistor 202. A cathode terminal of the zener diode 213 is connected to a gate terminal of the transistor 207. An anode terminal of the zener diode 213 is connected to a source terminal of the transistor 207. A cathode terminal of the zener diode 214 is connected to a gate terminal of the transistor 208. An anode terminal of the zener diode 214 is connected to a source terminal of the transistor 208.

The receiver 20 of the second construction example includes a pair of transistors 201 and 202, source terminals of which are connected each other and a receiving output signal ROUT is provided from a drain terminal of one of the transistors. The receiver 20 also includes a transistor 207, a gate terminal of which is connected to an input terminal of the receiving input signal RIN and a source terminal of which is connected to a gate terminal of the transistor 207. The receiver 20 also includes a transistor 208, a gate terminal of which is connected to an input terminal of the receiving reference voltage VREF, and a source terminal of which is connected to a gate terminal of the transistor 202. The receiver 20 also includes a zener diode 211, a cathode terminal of which is connected to a gate terminal of the transistor 201, and an anode terminal of which is connected to a source terminal of the transistor 201. The receiver 20 also includes a zener diode 212, a cathode terminal of which is connected to a gate terminal of the transistor 202, and an anode terminal of which is connected to a source terminal of the transistor 202. The receiver 20 also includes a zener diode 213, a cathode terminal of which is connected to a gate terminal of the transistor 207, and an anode terminal of which is connected to a source terminal of the transistor 207. The receiver 20 also includes a zener diode 214, a cathode terminal of which is connected to a gate terminal of the transistor 208, and an anode terminal of which is connected to a source terminal of the transistor 208. The receiver 20 also includes a current source 205 to generate a source current of the transistors 201 and 202, a current source 209 to generate a source current of the transistor 207, and a current source 210 to generate a source current of the transistor 208.

Each zener voltages of the zener diodes 211 to 214 are designed not to exceed a gate-source breakdown voltage (=approximately 5V) of the NMOS FETs 201 and 202 and 207 and 208, respectively.

Apart from the transistors 201 and 202 constructing a pair of transistors, using transistors 207 and 208 as a source follower, and each of the receiving input signal RIN and the receiving reference voltage VREF is provided to respective gate terminals of the transistors 207 and 208. Each of the zener diodes 211 to 214 is connected between respective gate and source terminals of the transistors 201, 202, 207, and 208. Thus the gate-source voltages of each of the transistors 201, 202, 207 and 208 are clamped not to exceed breakdown voltages of the transistors. Therefore a breakdown of a transistor is prevented, and a dynamic range of the bus side power source voltage V2 can be widened then the receiver 20 of a first construction example. Also, as for manufacturing the transistors 201 and 202, a high breakdown voltage element (i.e., a low speed element) is not required, then a speed of the LIN interface 2 is improved.

The receiver 20 of the second construction example includes a current restriction resistor 215 connected between a gate terminal of the transistor 201 and a source terminal of the transistor 207. This construction makes it possible to restrict a current which flows through from an input terminal of the receiving input signal MN to an input terminal of the receiving reference voltage VREF via the clamped zener diodes 213 and 211 and forward biased zener diodes 212 and 214. And also thus construction makes it possible to restrict a current which flows through from an input terminal of the receiving reference voltage VREF to an input terminal of the receiving input signal RIN via the clamped zener diodes 214 and 212 and the forward biased zener diodes 211 and 213.

Figure 14:
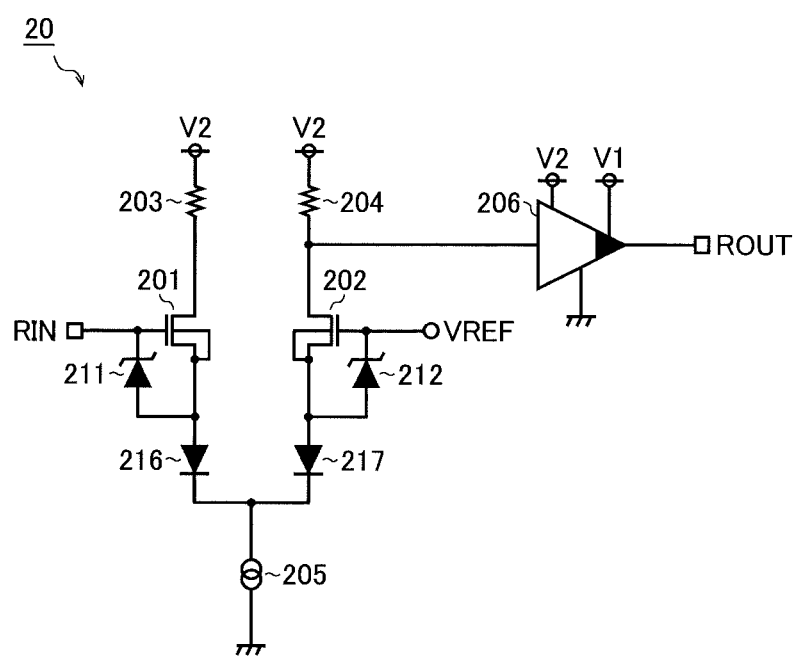
FIG. 14 is a circuit diagram showing a third construction example of the receiver 20.

FIG. 14 is a circuit diagram showing a third construction example of the receiver 20. The receiver 20 of the third construction example includes zener diodes 211 and 212, and diodes 216 and 217 in addition to circuit elements 201 to 206 of the first construction example.

A cathode terminal of the zener diode 211 is connected to a gate terminal of the transistor 201. Anode terminals of each of the zener diodes 211 and 216 are connected to a source terminal of the transistor 201. A cathode terminal of the zener diode 212 is connected to a gate terminal of the transistor 202. Anode terminals of each of the zener diodes 212 and the diode 217 are connected to a source terminal of the transistor 202. Cathode terminals of each of the diodes 216 and 217 are connected to the constant the constant current source 205.

The receiver 20 of the third construction example includes a pair of a first transistors 201 and 202, source terminals of which are connected each other and a receiving output signal ROUT is provided from a drain terminal of one of the transistors. The receiver 20 also includes a zener diode 211, a cathode terminal of which is connected to a gate terminal of the transistor 201 and an anode terminal of which is connected to a source terminal of the transistor 201. The receiver 20 also includes a zener diode 212, a cathode terminal of which is connected to a gate terminal of the transistor 202 and an anode terminal of which is connected to a source terminal of the transistor 202. The receiver 20 also includes a constant current source 205 to generate a source current of the transistors 201 and 202. The receiver 20 also includes a diode 216, an anode terminal of which is connected to a source terminal of the transistor 201 and a cathode terminal of which is connected to the constant current source 205. The receiver 20 also includes a diode 217, an anode terminal of which is connected to a source terminal of the transistor 202 and a cathode terminal of which is connected to the constant current source 205.

As for the receiver 20, as a clamp element, each of the zener diodes 211 and 212 is connected between respective gate and source terminals of the transistors 201 and 202. Thus the gate-source voltages of each of the transistors 201 and 202 are clamped not to exceed breakdown voltages of the transistors same as the second construction example, then a breakdown of the transistor can be prevented.

The diode 216 is inserted between the source terminal of the transistor 201 and the constant current source 205. This construction makes it possible to cut off a current flowing through from an input terminal of the receiving reference voltage VREF to an input terminal of the receiving input signal RIN via the broken-down zener diode 212 and the forward biased diode 217. The diode 217 is inserted between the source terminal of the transistor 202 and the constant current source 205. This construction makes it possible to cut off a current flowing through from the receiving input signal RIN to the input terminal of the receiving reference signal VREF via the broken-down zener diode 211 and the forward biased diode 216.

Thus, the receiver 20 of the third construction example makes it possible to realize at least same effect of the second construction example with fewer elements compared to the second construction example.

Figure 15:
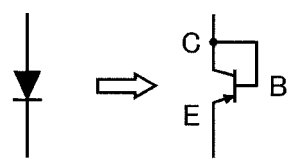
FIG. 15 is a diagram showing a diode formed with a PNP bipolar transistor.

For the receiver 20 of the third construction example, it is desirable to construct the diodes 216 and 217 by a diode-connected PNP bipolar transistor as illustrated in FIG. 15, because a breakdown voltage of which for the forward direction is high (e.g., approximately 50 voltage). This construction makes it possible to cut off a current without fail even if a high backward bias voltage is supplied.

A high breakdown voltage for both positive and negative voltages (e.g., −27 voltage to 40 voltage) are required for LIN interface part 2. The receiver 20 of the third construction example meets the requirement.

Above described technique to enhance a breakdown voltage is not only used for the illustrated car mounted communication system, but also used for a receiver which receives a large amplitude signal.

In one aspect, the transmitter includes a capacitor from one end of which a charge voltage is derived, a first constant current source to generate a charge current for the capacitor, a second constant current source to generate a discharge current for the capacitor, a charge/discharge controller to perform charge/discharge control of the capacitor based on a logic level of a transmission input signal and a comparison result between the charge voltage and a reference voltage, an output stage to generate the transmission output signal, a slew rate of which is set in response to the charge voltage, and an amplitude of the transmission output signal is set in response to an output side power source voltage. The transmitter also includes a reference voltage generator to fluctuate the reference voltage depend on the output side power source voltage, and a constant current controller to fluctuate a current value of the charge current and the discharge current depend on the reference voltage.

In some implementations, the output stage includes an open-drain transistor, a conduction level of which is controlled in response to the charge voltage.

In some implementations, the transmitter includes a booster to supply a boost current to the open-drain transistor until the open-drain transistor can operate in its saturation region, and to stop supplying a boost current when the open-drain transistor becomes a state which can operate in its saturation region.

In some implementations the charge/discharge controller includes a first switch to conduct or cut off a connection node between the capacitor and the first constant current source, a second switch to conduct or cut off a connection node between the capacitor and the second constant current source, and a switching controller to perform ON-OFF control of the first switch and the second switch.

In some implementations, the reference voltage generator is a resistor ladder which generates the reference voltage by dividing the output side power source voltage.

In some implementations, the constant current controller includes a reference current generator to perform voltage/current conversion and generates the reference current from the reference voltage, and a current mirror circuit to reproduce the reference current as the charge current and the discharge current.

In some implementations, the output stage includes a diode, an anode terminal of which is connected to an output terminal of the transmission output signal, and a cathode terminal of which is connected to a drain terminal of the open-drain transistor.

In some implementations, the diode is formed in a floating region surrounded by an embedded insulating layer formed on a region of a semiconductor substrate, and surrounded by a collector wall formed on around an upper part of the embedded insulating layer.

In some implementations, the output stage includes a double diffused MOS FET connected between a drain terminal of the open-drained transistor and a cathode terminal of the diode.

In some implementations, the interface device includes the transmitter according to the disclosure formed on a signal transmission path, and a receiver formed on the signal transmission path.

According to another aspect, the receiver includes a pair of a first transistor and a second transistor, source terminals of which are connected each other and a receiving output signal is provided from a drain terminal of one of the transistors. The receiver also includes a third transistor, a gate terminal of which is connected to an input terminal of the receiving input signal and a source terminal of which is connected to a gate terminal of the first transistor. The receiver also includes a fourth transistor, a gate terminal of which is connected to an input terminal of the receiving reference voltage and a source terminal of which is connected to a gate terminal of the second transistor. The receiver also includes a first zener diode, a cathode terminal of which is connected to a gate terminal of the first transistor and an anode terminal of which is connected to a source terminal of the first transistor. The receiver also includes a second zener diode, a cathode terminal of which is connected to a gate terminal of the second transistor and an anode terminal of which is connected to a source terminal of the second transistor. The receiver also includes a third zener diode, a cathode terminal of which is connected to a gate terminal of the third transistor and an anode terminal of which is connected to a source terminal of the third transistor. The receiver also includes a fourth zener diode, a cathode terminal of which is connected to a gate terminal of the fourth transistor and an anode terminal of which is connected to a source terminal of the fourth transistor. The receiver also includes a first current source to generate a source current of the first transistor and the second transistor, a second current source to generate a source current of the third transistor, and a third current source to generate a source current of the fourth transistor.

In some implementations, the receiver further includes a current restriction resistor connected between a gate terminal of the first transistor and a source terminal of the third transistor.

In some implementations, the receiver further includes a pair of a first transistor and a second transistor, source terminals of which are connected each other and a receiving output signal is provided from a drain terminal of one of the transistors. The receiver also includes a first zener diode, a cathode terminal of which is connected to a gate terminal of the first transistor and an anode terminal of which is connected to a source terminal of the first transistor. The receiver also includes a second zener diode, a cathode terminal of which is connected to a gate terminal of the second transistor and an anode terminal of which is connected to a source terminal of the second transistor. The receiver also includes a current source to generate a source current of the first transistor and the second transistor. The receiver also includes a first diode, an anode terminal of which is connected to a source terminal of the first transistor and a cathode terminal of which is connected to the current source. The receiver also includes a second diode, an anode terminal of which is connected to a source terminal of the second transistor, and a cathode terminal of which is connected to the current source.

In some implementations, the first diode and the second diode are diode-connected PNP bipolar transistors.

According to another aspect, a car mounted communication system includes an electric control unit, a bus, and an interface device according to the disclosure to control a two way communication between the electric control unit and the bus.

The transmitter, interface device and a car mounted communication system can prevent fluctuations of a duty of an input signal and an output signal in accordance with fluctuations of a power source voltage.

A technique illustrated in the disclosure can be used to enhance a reliability of a car mounted communication system.

A number of implementations of the invention have been described. Nevertheless, various modifications can be made without departing from the spirit and scope of the invention. Accordingly, other implementations are within the scope of the claims.

LIST OF REFERENCE NUMERALS

1 E C U [Electronic Control Unit]
2 LIN (Local Interconnect Network) interface part
3 LIN bus
4 manipulating part
5 driver for a door mirror
6 driver for a power window
10 transmitter
20 receiver
101, 102 switch 103, 104 constant current source
105 capacitor
106 switching controller
107 reference voltage generator
108 constant current controller
109 amplifier
110~112 NMOS FET
113, 114 PMOS FET
115, 116 resistor
117 NMOS FET
118, 119 constant current source
120 switch
121 comparator
122 diode
123 double diffused NMOS FET
201, 202 NMOS FET
203, 204 resistor
205 constant current source
206 level shifter
207, 208 NMOS FET
209, 210 constant current source
211~214 zener diode
215 resistor
216, 217 diode
N1~N4 NMOS FET
P1~P4 PMOS FET
R1~R4 resistor
AMP1 amplifier
CMP1 comparator
OR1 logical sum operation
BST booster
Dp parasitic diode

What is claimed is:

1. A transmitter comprising:
a capacitor from one end of which a charge voltage is derived;
a first constant current source to generate a charge current for the capacitor;
a second constant current source to generate a discharge current for the capacitor;
a charge/discharge controller to perform charge/discharge control of the capacitor based on a logic level of a transmission input signal and a comparison result between the charge voltage and a reference voltage;
an output stage to generate the transmission output signal, wherein a slew rate of which is set in response to the charge voltage, and wherein an amplitude of the transmission output signal is set in response to an output side power source voltage;
a reference voltage generator to fluctuate the reference voltage depend on the output side power source voltage; and
a constant current controller to fluctuate a current value of the charge current and the discharge current depend on the reference voltage.

2. The transmitter according to claim 1, wherein the output stage comprises:
an open-drain transistor, a conduction level of which is controlled in response to the charge voltage.

3. The transmitter according to claim 2 comprising:
a booster to supply a boost current to the open-drain transistor until the open-drain transistor can operate in its saturation region, and to stop supplying a boost current when the open-drain transistor becomes a state which can operate in its saturation region.

4. The transmitter according to claim 1, wherein the charge/discharge controller comprises:

a first switch to conduct or cut off a connection node between the capacitor and the first constant current source;
a second switch to conduct or cut off a connection node between the capacitor and the second constant current source; and
a switching controller to perform ON-OFF control of the first switch and the second switch.

5. The transmitter according to claim 1, wherein the reference voltage generator is a resistor ladder which generates the reference voltage by dividing the output side power source voltage.

6. The transmitter according to claim 1, wherein the constant current controller comprises:
a reference current generator to perform voltage/current conversion and generates the reference current from the reference voltage; and
a current mirror circuit to reproduce the reference current as the charge current and the discharge current.

7. The transmitter according to claim 2, wherein the output stage comprises:
a diode, an anode terminal of which is connected to an output terminal of the transmission output signal, and a cathode terminal of which is connected to a drain terminal of the open-drain transistor.

8. The transmitter according to claim 7, wherein the diode is formed in a floating region surrounded by an embedded insulating layer formed on a region of a semiconductor substrate, and surrounded by a collector wall formed on around an upper part of the embedded insulating layer.

9. The transmitter according to claim 7, wherein the output stage comprises:
a double diffused MOS FET connected between a drain terminal of the open-drained transistor and a cathode terminal of the diode.

10. An interface device comprising:
a transmitter formed on a signal transmission path; and
a receiver formed on the signal reception path;
wherein the transmitter comprises:
a capacitor from one end of which a charge voltage is derived;
a first constant current source to generate a charge current for the capacitor;
a second constant current source to generate a discharge current for the capacitor;
a charge/discharge controller to perform charge/discharge control of the capacitor based on a logic level of a transmission input signal and a comparison result between the charge voltage and a reference voltage;
an output stage to generate the transmission output signal, wherein a slew rate of which is set in response to the charge voltage, and wherein an amplitude of the transmission output signal is set in response to an output side power source voltage;
a reference voltage generator to fluctuate the reference voltage depend on the output side power source voltage; and
a constant current controller to fluctuate a current value of the charge current and the discharge current depend on the reference voltage.

11. The interface device according to claim 10, wherein the receiver comprises:
a pair of a first transistor and a second transistor, source terminals of which are connected each other, wherein a receiving output signal is provided from a drain terminal of one of the first and second transistors;

a third transistor, a gate terminal of which is connected to an input terminal for the receiving input signal, and a source terminal of which is connected to a gate terminal of the first transistor;

a fourth transistor, a gate terminal of which is connected to an input terminal for the receiving reference voltage, and a source terminal of which is connected to a gate terminal of the second transistor;

a first zener diode, a cathode terminal of which is connected to a gate terminal of the first transistor, and an anode terminal of which is connected to a source terminal of the first transistor;

a second zener diode, a cathode terminal of which is connected to a gate terminal of the second transistor, and an anode terminal of which is connected to a source terminal of the second transistor;

a third zener diode, a cathode terminal of which is connected to a gate terminal of the third transistor, and an anode terminal of which is connected to a source terminal of the third transistor;

a fourth zener diode, a cathode terminal of which is connected to a gate terminal of the fourth transistor, and an anode terminal of which is connected to a source terminal of the fourth transistor;

a first current source to generate a source current of the first transistor and the second transistor;

a second current source to generate a source current of the third transistor; and a third current source to generate a source current of the fourth transistor.

12. The interface device according to claim 11, wherein the receiver further comprises:

a current restriction resistor inserted between a gate terminal of the first transistor and a source terminal of the third transistor.

13. The interface device according to claim 10, wherein the receiver further comprises:

a pair of a first transistor and a second transistor, source terminals of which are connected each other, wherein a receiving output signal is provided from a drain terminal of one of the first and second transistors;

a first zener diode, a cathode terminal of which is connected to a gate terminal of the first transistor, and an anode terminal of which is connected to a source terminal of the first transistor;

a second zener diode, a cathode terminal of which is connected to a gate terminal of the second transistor, and an anode terminal of which is connected to a source terminal of the second transistor;

a current source to generate a source current of the first transistor and the second transistor;

a first diode, an anode terminal of which is connected to a source terminal of the first transistor, and a cathode terminal of which is connected to the current source; and a second diode, an anode terminal of which is connected to a source terminal of the second transistor, and a cathode terminal of which is connected to the current source.

14. An interface device according to claim 13, wherein the first diode and the second diode are diode-connected PNP bipolar transistors.

15. A car mounted communication system comprising:

an electric control unit;

a bus; and an interface device to control a two way communication between the electric control unit and the bus;

wherein the interface device comprises:

a transmitter formed on a signal transmission path; and a receiver formed on the signal transmission path;

wherein the transmitter comprises:

a capacitor from one end of which a charge voltage is derived;

a first constant current source to generate a charge current for the capacitor;

a second constant current source to generate a discharge current for the capacitor;

a charge/discharge controller to perform charge/discharge control of the capacitor based on a logic level of a transmission input signal and a comparison result between the charge voltage and a reference voltage;

an output stage to generate the transmission output signal, wherein a slew rate of which is set in response to the charge voltage, and wherein an amplitude of the transmission output signal is set in response to an output side power source voltage;

a reference voltage generator to fluctuate the reference voltage depend on the output side power source voltage; and a constant current controller to fluctuate a current value of the charge current and the discharge current depend on the reference voltage.

* * * * *